(12) United States Patent
Kang et al.

(10) Patent No.: US 9,752,230 B2
(45) Date of Patent: Sep. 5, 2017

(54) ALPHA ALUMINA THIN FILM FOR PROCESSING DIFFICULT-TO-CUT MATERIAL AND CAST IRON

(71) Applicant: KORLOY INC., Seoul (KR)

(72) Inventors: Jae Hoon Kang, Cheongju-si (KR); Dong Youl Lee, Cheongju-si (KR); Jung Wook Kim, Cheongju-si (KR); Han Sung Kim, Cheongju-si (KR); Sung Gu Lee, Cheongju-si (KR); Jin Woo Ahn, Cheongju-si (KR); Sun Yong Ahn, Cheongju-si (KR)

(73) Assignee: KORLOY INC., Seoul (KR)

( * ) Notice: Subject to any disclaimer, the term of this patent is extended or adjusted under 35 U.S.C. 154(b) by 0 days.

(21) Appl. No.: 15/038,474

(22) PCT Filed: Nov. 26, 2014

(86) PCT No.: PCT/KR2014/011429
§ 371 (c)(1),
(2) Date: May 23, 2016

(87) PCT Pub. No.: WO2015/099298
PCT Pub. Date: Jul. 2, 2015

(65) Prior Publication Data
US 2016/0298232 A1    Oct. 13, 2016

(30) Foreign Application Priority Data
Dec. 23, 2013  (KR) .................. 10-2013-0161700

(51) Int. Cl.
*C23C 16/06* (2006.01)
*C23C 28/04* (2006.01)
(Continued)

(52) U.S. Cl.
CPC ................ *C23C 16/06* (2013.01); *C09D 1/00* (2013.01); *C23C 16/44* (2013.01); *C23C 28/044* (2013.01); *C23C 28/048* (2013.01)

(58) Field of Classification Search
CPC ....... C23C 16/06; C23C 16/44; C23C 28/044; C23C 28/048; C09D 1/00
See application file for complete search history.

(56) References Cited

U.S. PATENT DOCUMENTS 5,487,625 A * 1/1996 Ljungberg ............ C23C 16/403 407/119
6,187,421 B1 * 2/2001 Moriguchi ............ C23C 28/044 407/119

(Continued)

FOREIGN PATENT DOCUMENTS

JP    63-195268 A    8/1988
JP    02-30406 A     1/1990
(Continued)

OTHER PUBLICATIONS

International Search Report for PCT/KR2014/011429 dated Mar. 6, 2015 from Korean Intellectual Property Office.

*Primary Examiner* — Nathan Van Sell
(74) *Attorney, Agent, or Firm* — Revolution IP, PLLC

(57) ABSTRACT

Disclosed is an alpha alumina ($\alpha$-Al2O3) thin film comprising the lower layer formed on the base material made from cemented carbide; and the $\alpha$-Al2O3 thin film layer formed on the lower layer, wherein when the $\alpha$-Al2O3 thin film layer is divided, from the total thickness (T) thereof, into a D1 layer which is from an interface layer to 0.15T, a D2 layer which is from 0.15T to 0.4T, and a D3 layer which is from 0.4T to 1T, an S1 (D3 layer grain size/D1 layer grain size) is 2-5.5 and an S2 (D2 layer grain size/D1 layer grain size) is 1.5-4.

5 Claims, 6 Drawing Sheets

(51) Int. Cl.
*C23C 16/44* (2006.01)
*C09D 1/00* (2006.01)

(56) References Cited

U.S. PATENT DOCUMENTS

| | | | | |
|---|---|---|---|---|
| 7,955,722 B2* | 6/2011 | Tamagaki | ............. | C23C 14/081 427/248.1 |
| 8,309,236 B2* | 11/2012 | Tamagaki | ............. | C23C 14/081 427/248.1 |
| 2004/0180776 A1* | 9/2004 | Brandt | ................. | C04B 35/117 501/89 |
| 2005/0276990 A1* | 12/2005 | Kohara | .................... | C23C 8/02 428/469 |
| 2006/0003186 A1 | 1/2006 | Park et al. | | |
| 2010/0330360 A1 | 12/2010 | Tanibuchi et al. | | |
| 2011/0200806 A1* | 8/2011 | Tamagaki | ............. | C23C 14/081 428/216 |

FOREIGN PATENT DOCUMENTS

| | | |
|---|---|---|
| JP | 05-345976 A | 12/1993 |
| JP | 2556101 B2 | 11/1996 |
| JP | 2012-254523 A | 12/2012 |
| KR | 10-0600573 B1 | 7/2006 |
| KR | 10-2010-0135641 A | 12/2010 |
| KR | 10-2012-0053171 A | 5/2012 |

* cited by examiner

[Fig. 1]
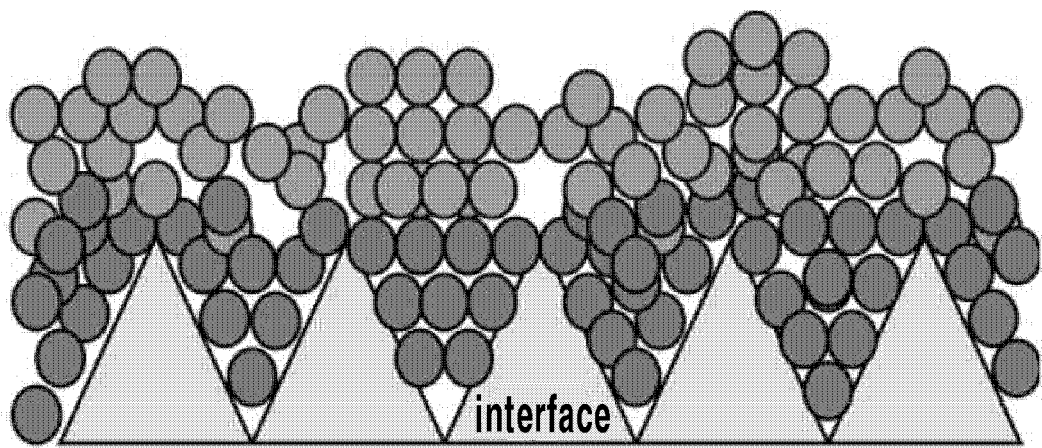

[Fig. 2]
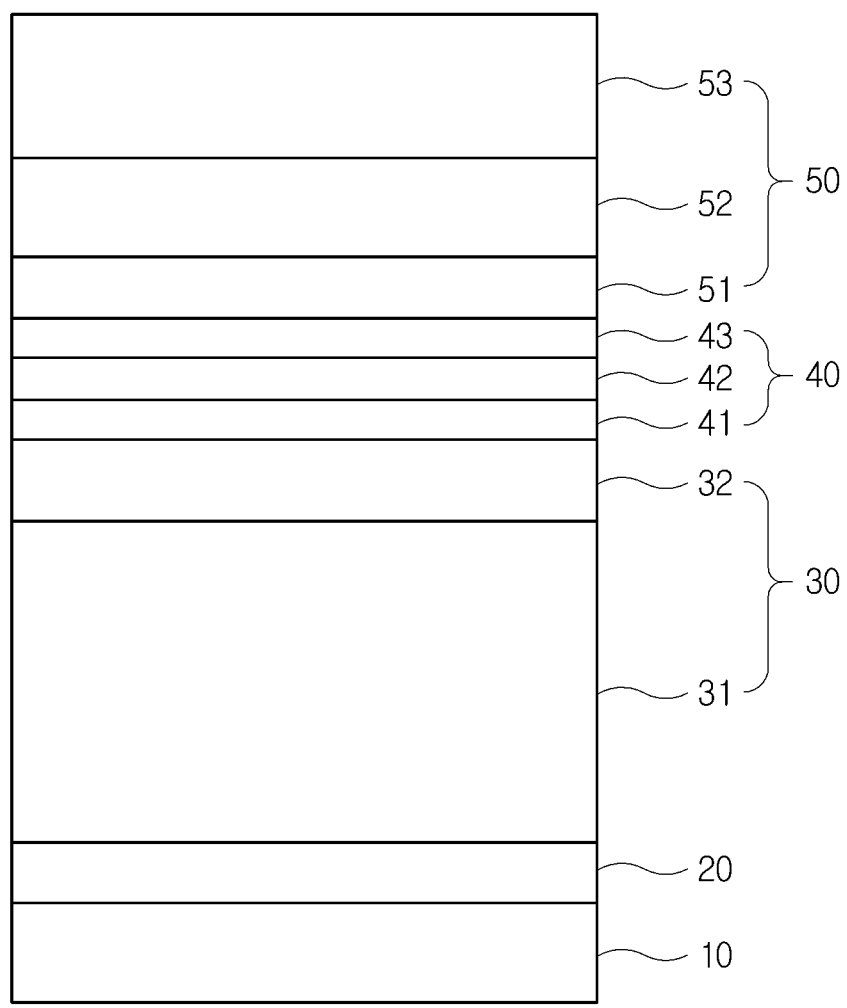

[Fig. 3]
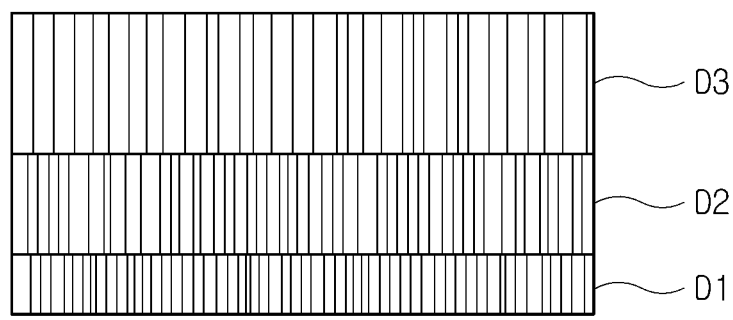
(a)
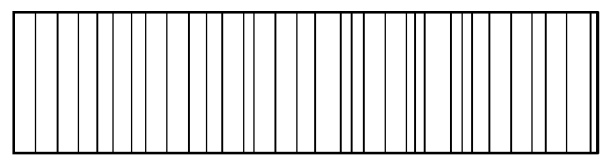
(b)
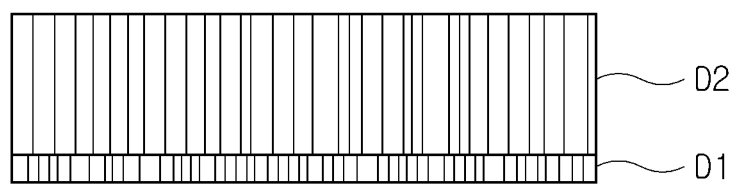
(c)

[Fig. 4]
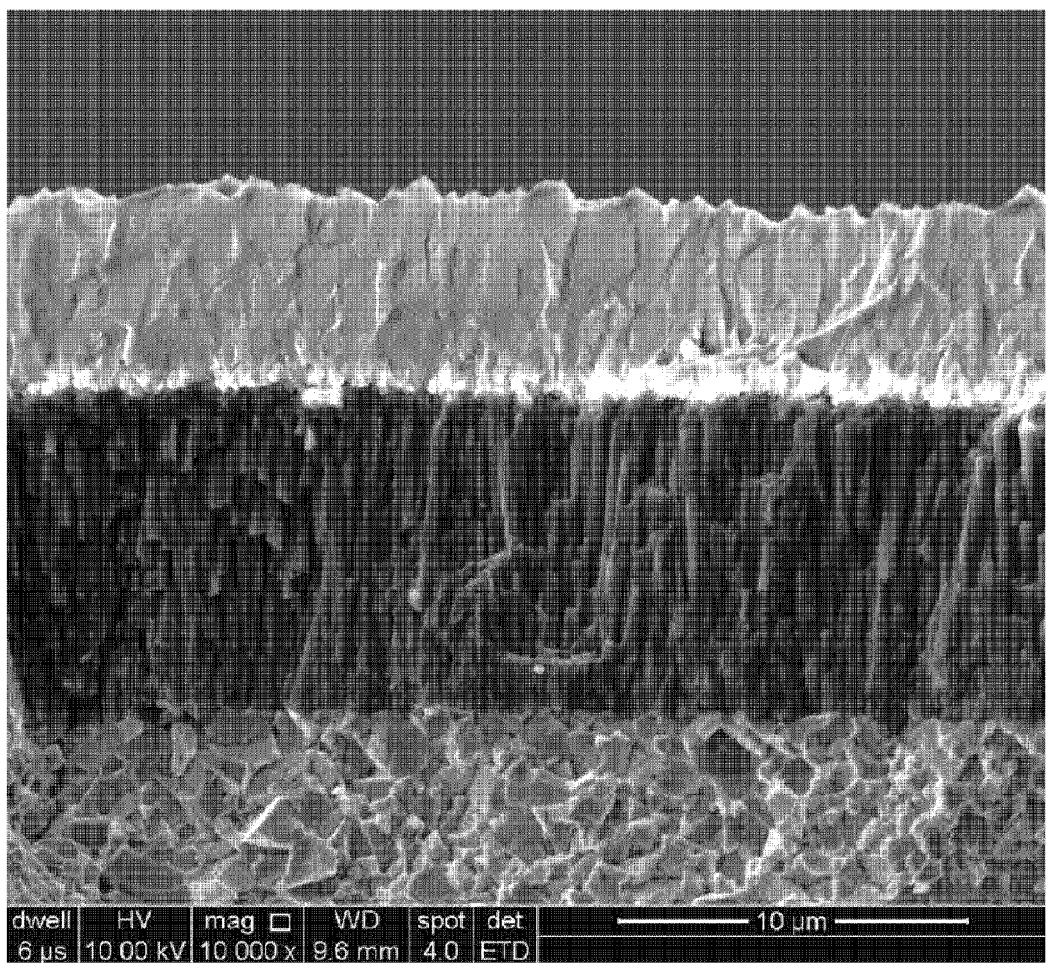

[Fig. 5]
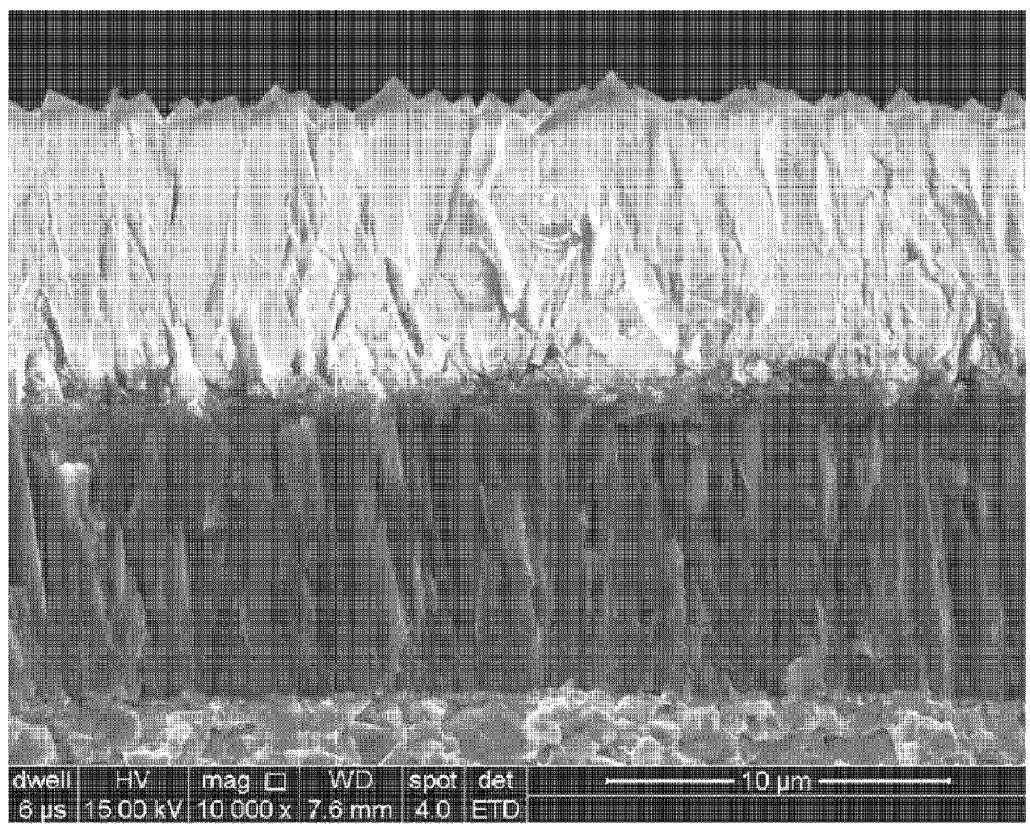

[Fig. 6]
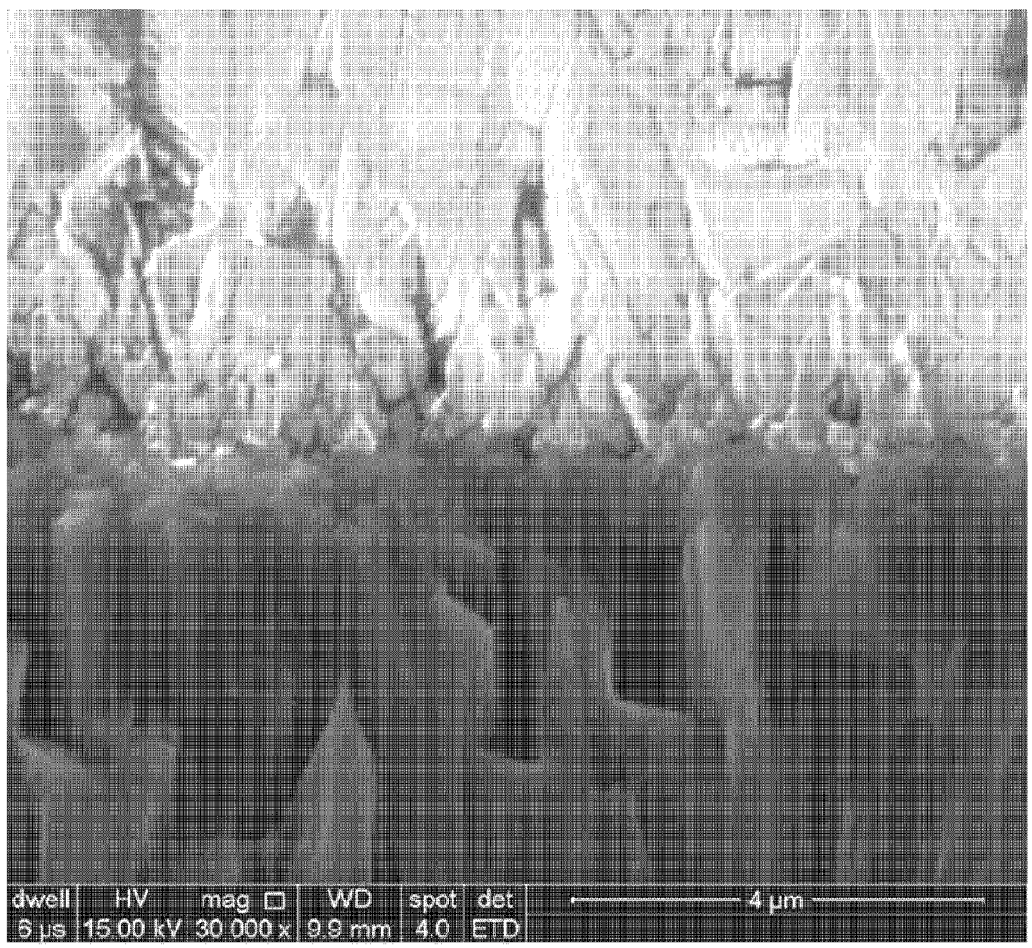

ably low thermal conductivity. More specifically, the present invention relates to significantly improving the adhesive strength of an $\alpha$-Al$_2$O$_3$ thin film layer through controlling the nucleation rate of a lower layer which is formed on a base material made of cemented carbide, and the $\alpha$-Al$_2$O$_3$ thin film layer which is formed on the lower layer.
ALPHA ALUMINA THIN FILM FOR PROCESSING DIFFICULT-TO-CUT MATERIAL AND CAST IRON

CROSS REFERENCE TO PRIOR APPLICATIONS

This application is a National Stage Application of PCT International Patent Application No. PCT/KR2014/011429 filed on Nov. 26, 2014, under 35 U.S.C. §371, which claims priority to Korean Patent Application No. 10-2013-0161700 filed on Dec. 23, 2013, which are all hereby incorporated by reference in their entirety.

TECHNICAL FIELD

The present invention relates to an alpha alumina ($\alpha$-Al$_2$O$_3$) thin film which is formed on the top layer of a hard thin film used for cutting a material, such as a difficult-to-cut material or a cast iron, having a comparatively low thermal conductivity. More specifically, the present invention relates to significantly improving the adhesive strength of an $\alpha$-Al$_2$O$_3$ thin film layer through controlling the nucleation rate of a lower layer which is formed on a base material made of cemented carbide, and the $\alpha$-Al$_2$O$_3$ thin film layer which is formed on the lower layer.

BACKGROUND ART

A cutting edge in a cutting tool is exposed to a high temperature environment of about 1000° C. during high-speed processing of a high hardness material. Not only is wear generated by friction and oxidation due to contact with the work piece, but a mechanical shock such as an interruption is also received. Therefore, it is critical for the cutting tool to have an appropriate wear resistance and toughness.

In order to impart such critical wear resistance and toughness to the cutting tool, a hard thin film formed through chemical vapor deposition (hereinafter referred to as 'CVD') or physical vapor deposition (hereinafter referred to as 'PVD') is typically formed on a surface of a cemented carbide which is used as the cutting tool.

Such a hard thin film is composed of a single layer or multiple layers of a non-oxide based thin film (for example, TiN, TiC, TiCN), an oxide-based thin film having excellent oxidation resistance (for example, Al$_2$O$_3$), or a mixed layer thereof. Examples of the non-oxide based thin film include carbides, nitrides, and carbonitrides of group 4, 5, and 6 metal elements, such as TiN, TiC, and TiCN. Representative examples of the oxide based thin film include $\alpha$-Al$_2$O$_3$ or $\kappa$-Al$_2$O$_3$.

Among these, $\alpha$-Al$_2$O$_3$ is a stable phase at high temperatures, and thus does not undergo a phase change during the cutting process, but exhibits superb wear resistance. However, for $\alpha$-Al$_2$O$_3$ to be coated directly onto the non-oxide based thin film, a high temperature of about 1040° C. is required. Here, the $\alpha$-Al$_2$O$_3$ that is formed has a large crystal grain size (about 1-6 μm), and a large number of defects such as micropores are present in the crystal. Thus, the mechanical strength of the thin film is poor.

In order to overcome such limitations, coating a first stage oxide layer on a non-oxide thin film and then coating $\alpha$-Al$_2$O$_3$ thereon has been proposed. When such a stage oxide layer is used, the coating temperature may be reduced to about 1000° C. to 1020° C. when coating $\alpha$-Al$_2$O$_3$.

However, the $\alpha$-Al$_2$O$_3$ prepared through such a method still does not exhibit a sufficient adhesive strength, and thus it is easy for peeling to occur.

As a result, several improved methods for enhancing the adhesive strength between the representative oxide based thin film, that is, $\alpha$-Al$_2$O$_3$, and the non-oxide based thin film have been proposed.

Japanese Patent Application Laid-open Publication No. 63-195268 discloses a method for coating with a TiCNO layer having a thickness of 5 μm at 1030° C. to 1100° C. and then coating $\alpha$-Al$_2$O$_3$ thereon at 960° C. to 1000° C. Japanese Patent Application Laid-open Publication No. 02-30406 discloses a method for coating $\alpha$-Al$_2$O$_3$ on a TiCO or TiCNO layer having a thickness of 1 μm. Japanese Patent Application Laid-open Publication No. 05-345976 discloses a method for using TiCl$_4$, CO, H$_2$, or N$_2$ gas to form a TiCNO or TiCO layer having a thickness of 0.5 to 3 μm and then coating $\alpha$-Al$_2$O$_3$ thereon at about 1000° C.

Meanwhile, the $\alpha$-Al$_2$O$_3$ layer has a column-shaped columnar structure. Consequently, since the grain size of the $\alpha$-Al$_2$O$_3$ layer is large, it is difficult for the surface roughness of the lower layer formed below the $\alpha$-Al$_2$O$_3$ layer to be sufficiently filled in. As a result, pores are formed in the interfacial region, and thereby there is a tendency for the adhesive strength to be reduced.

Therefore, as disclosed in the prior art patent documents, even when a bonding layer is made of a variety of compositions, it is difficult to achieve a sufficient adhesive strength for the $\alpha$-Al$_2$O$_3$ layer.

DISCLOSURE OF THE INVENTION

Technical Problem

The purpose of the present invention is to overcome the limitations of the conventional techniques described above. It is an object to provide an $\alpha$-Al$_2$O$_3$ thin film in which the adhesive strength is significantly improved at an interface in the $\alpha$-Al$_2$O$_3$ layer by realizing a microstructure in which the grain size in the $\alpha$-Al$_2$O$_3$ layer is regulated in multiple stages when forming the $\alpha$-Al$_2$O$_3$ layer.

Technical Solution

As a method for overcoming the above limitations, the present invention provides an alpha alumina ($\alpha$-Al$_2$O$_3$) thin film which has a thickness of T and is formed on a lower layer which is formed on a base material, the $\alpha$-Al$_2$O$_3$3 thin film being divided into a D1 layer which is positioned between an interfacial layer and 0.15T above the interfacial layer; a D2 layer which is positioned between 0.15T and 0.4T above the interfacial layer; and a D3 layer which is positioned between 0.4T and 1T above the interfacial layer, wherein S1 (the grain size of the D3 layer/the grain size of the D1 layer) is 2 to 5.5, and S2 (the grain size of the D2 layer/the grain size of the D1 layer) is 1.5 to 4.

The base material may contain 5 to 10 wt % of Co, and at most 1 wt % of (Ta,Nb)C.

The lower layer may include a TiN layer formed on the base material; a MT-TiCN layer formed on the TiN layer; and an interfacial layer containing Ti and formed on the TiCN layer.

The thickness of TiN layer may be 0.1 to 2 μm; the thickness of the MT-TiCN layer may be 3 to 10 μm; the thickness of the interfacial layer may be 0.1 to 1 μm; and the thickness of the $\alpha$-Al$_2$O$_3$ layer may be 2 to 8 μm.

The grain size of the D1 layer may be 0.1 to 0.5 μm; the grain size of the D2 layer may be 0.15 to 0.8 μm; and the grain size of the D3 layer may be 0.4 to 1.5 μm. Here, the grain size of the D3 layer is larger than the grain size of the D2 layer.

The interfacial layer may include a $Ti_xAl_{1-x}CNO$ layer formed on the MT-TiCN layer; and a $Al_yTi_{1-y}CNO$ layer formed on the $Ti_xAl_{1-x}CNO$ layer.

The surface roughness (Ra) of the $\alpha$-$Al_2O_3$ thin film may be at most 250 nm.

Advantageous Effects

An $\alpha$-$Al_2O_3$ thin film according to the present invention includes a D1 layer disposed on a boundary area with a lower layer and having a fine $\alpha$-$Al_2O_3$ grain size, a D2 layer disposed on the D1 layer and having a larger grain size than the D1 layer, and a D3 layer disposed on the D2 layer and having a larger grain size than the D2 layer. Due to having a structure in which the D1 layer is composed of the grain size which is small enough to sufficiently fill in the gaps in a rough grain size of the lower layer, and in which the grain size increases when moving up to the D2 layer and the D3 layer, the pores in the boundary area may be significantly reduced and the peel resistance of the $\alpha$-$Al_2O_3$ may be greatly improved when compared to a typical $\alpha$-$Al_2O_3$ thin film.

BRIEF DESCRIPTION OF THE DRAWINGS

FIG. 1 is a schematic view of a nucleation process in a process for forming an $\alpha$-$Al_2O_3$ thin film according to an embodiment of the present invention.

FIG. 2 is a schematic view of a hard thin film that includes an $\alpha$-$Al_2O_3$ thin film according to an embodiment of the present invention.

FIG. 3 illustrates schematic views of the microstructure of an $\alpha$-$Al_2O_3$ thin film according to Examples 1 to 12, the microstructure of an $\alpha$-$Al_2O_3$ thin film according to Comparative Examples 1 and 3, and the microstructure of an $\alpha$-$Al_2O_3$ thin film according to Comparative Examples 2 and 4 of the present invention.

FIG. 4 is a cross-sectional scanning electron microscope image of a hard thin film formed according to Example 11 of the present invention.

FIG. 5 is a cross-sectional scanning electron microscope image of a hard thin film formed according to Comparative Example 4 of the present invention.

FIG. 6 is an enlarged view of a portion of a scanning electron microscope image of an $\alpha$-$Al_2O_3$ thin film formed according to Comparative Example 4 of the present invention.

MODE FOR CARRYING OUT THE INVENTION

Hereinafter, exemplary embodiments of the present invention are described in detail with reference to the accompanying drawings. However, exemplary embodiments of the present invention may be modified into various different forms, and the scope of the present invention is not limited to the embodiments described below. The embodiments of the present invention are provided to better describe the present invention to a person with average skill in the art. Moreover, it will be understood that dimensions or thicknesses of films or regions in the drawings are exaggerated in order to assist in understanding the invention.

In the description below, the following terms are defined as follows:

For a thickness (T) of an alpha alumina ($\alpha$-$Al_2O_3$) thin film, when a line is drawn in a scanning electron microscope image at 10000× magnification to be parallel with respect to the midpoint, that is 0.075T, of a thickness between an interfacial layer which is at the bottom to 0.15T, the 'grain size of a D1 layer' indicates the average of the spacing between grains that intersect the line.

For the thickness (T) of the alpha alumina ($\alpha$-$Al_2O_3$) thin film, when a line is drawn in a scanning electron microscope image at 10000× magnification to be parallel with respect to the midpoint, that is 0.275T above the interfacial layer, of a thickness between 0.15T to 0.4T above the bottom, the 'grain size of a D2 layer' indicates the average of the spacing between grains that intersect the line.

For the thickness (T) of the alpha alumina ($\alpha$-$Al_2O_3$) thin film, when a line is drawn in a scanning electron microscope image at 10000× magnification to be parallel with respect to the midpoint, that is 0.7T above the interfacial layer, of a thickness between 0.4T to 1T above the bottom, the 'grain size of a D3 layer' indicates the average of the spacing between grains that intersect the line.

The present inventors have discovered that in forming a hard thin film, which includes the $\alpha$-$Al_2O_3$ layer, in a cemented carbide, a large number of pores are formed in a boundary area when the $\alpha$-$Al_2O_3$ having a large grain size is formed on a rough surface of the interfacial layer formed below the $\alpha$-$Al_2O_3$ layer, and such pores degrade the peel resistance of the $\alpha$-$Al_2O_3$ layer.

Accordingly, in forming the $\alpha$-$Al_2O_3$ layer, unlike a typical method in which the entire $\alpha$-$Al_2O_3$ layer is formed through nucleation which is immediately followed by grain growth, it was revealed, as illustrated in FIG. 1, that when extremely small $\alpha$-$Al_2O_3$ nuclei are nucleated and then grown slightly (grown up to about 0.15T of the total thickness of the $\alpha$-$Al_2O_3$ thin film (blue in the drawing)), $\alpha$-$Al_2O_3$ nuclei are nucleated again thereon and then grown to a predetermined size (grown up to about 0.4T of the total thickness of the $\alpha$-$Al_2O_3$ thin film), and then $\alpha$-$Al_2O_3$ nuclei are nucleated again and then formed to the final thickness of the thin film, the peel resistance is significantly improved when compared to a typical $\alpha$-$Al_2O_3$ thin film such that the lifetime of a cutting tool may be improved. Thus, it was possible to conceive the present invention.

FIG. 2 is a schematic view of a hard thin film that includes an $\alpha$-$Al_2O_3$ thin film according to an embodiment of the present invention. As illustrated in FIG. 2, the hard thin film is composed of a structure that includes a base material 10 made of cemented carbide, an underlayer 20 disposed on the based material 10 and made of TiN, an intermediate layer 30 disposed on the underlayer 20 and made of MT-TiCN, an interfacial layer 40 which is disposed on the intermediate layer 30 and is used for increasing the adhesive strength with the $\alpha$-$Al_2O_3$ thin film, and an $\alpha$-$Al_2O_3$ layer 50 disposed on the interfacial layer 40.

Any material for cutting tools in which the material forms the $\alpha$-$Al_2O_3$ thin film may be used for the base material 10, such as cemented carbide or cermet. Desirably, cemented carbide may be used. For example, cemented carbide containing 5 to 10 wt % of Co and at most 1 wt % of a grain growth inhibitor such as (Ta,Nb)C may be used.

For the underlayer 20, a TiN layer is typically formed, but the underlayer is not limited thereto. The TiN layer is desirably 0.1 to 2 μm.

For the intermediate layer 30, a TiCN layer formed through MT-CVD [a deposition technique performed using $H_2$, $N_2$, $TiCl_4$, $CH_3CN$, or the like, at an intermediate temperature (about 850 to 900° C.)], but the intermediate layer is not limited thereto. A TiCN layer formed through HT-CVD [a deposition technique performed using $H_2$, $N_2$, $TiCl_2$, $CH_3CN$, or the like, at an intermediate temperature (about 900 to 1050° C.)] may be further formed on the intermediate layer 30. The thickness of the MT-TiCN layer is desirably 3 to 10 μm.

The interfacial layer 40 may specifically include a TiAl-CNO layer 31, AlTiCNO layer 32, and a $TiO_2$ layer 31 which are formed on the intermediate layer 30, but is not limited thereto, and any typical TiCNO layer, and the like, may be used. The thickness of the interfacial layer 40 is desirably 0.1 to 1 μm.

The α-$Al_2O_3$ layer 50 includes a D1 layer 41 extending from the interfacial layer 40 to about 0.15T of the thin film thickness T, a D2 layer 42 extending from the D1 layer 41 to about 0.4T of the thin film thickness T, and a D3 layer 43 extending from the D2 layer 42 to the ultimate thickness.

Here, the grain size of the D1 layer is desirably 0.1 to 0.5 μm. This is because, when the grain size is less than 0.1 μm, the α-$Al_2O_3$ grain growth must be controlled to be low, and thus the film forming rate of the thin film is significantly reduced, and when the grain size is greater than 0.5 μm, it is difficult to nucleate α-$Al_2O_3$ and thereby fill in the interfacial layer having needle shapes which are at most 0.8 μm, and thus pores are easily formed at the interface. When considering the grain size of the interfacial layer, filling in without pores is possible when the grain size of the D1 layer is at most ½ of the grain size of the interfacial layer.

Moreover, the grain size of the D2 layer is desirably 0.15 to 0.8 μm. This is because, when the grain size is less than 0.15 μm the film forming rate of the thin film is significantly reduced as in the case of the D1 layer, and when the grain size is greater than 0.8 μm, the difference in the size ratio between D1 and D2 increases such that a dense, columnar α-$Al_2O_3$ cannot be formed.

Furthermore, the grain size of the D3 layer is desirably 0.4 to 1.5 μm. When the grain size is less than 0.4 μm, the film forming rate of the thin film is deficient, and when the grain size is greater than 1.5 μm, the dense, columnar α-$Al_2O_3$ cannot be formed in the D2 layer and the D3 layer.

In addition, S1, which is the ratio of the grain size of the D3 layer to the grain size of the D1 layer (grain size of the D3 layer/grain size of the D1 layer), is desirably 2 to 5.5. This is because, when S1 is less than 2, there is a limitation, such as above with respect to the thin film growth layer, in that the thin film growth rate of the D3 layer is reduced, and when S1 is greater than 5.5, the grain growth in the D3 layer may be excessive such that the columnar growth becomes fan-shaped, and thus the chip resistance may be reduced. Moreover, S2, which is the ratio of the grain size of the D2 layer to the grain size of the D1 layer (grain size of the D2 layer/grain size of the D1 layer), is desirably 1.5 to 4. This is because the same reasons as above also apply for when S2 is less than 1.5 or greater than 4.

Hereinafter, the present invention is described in greater detail through exemplary embodiments.

First, an underlayer was made by using chemical vapor deposition (CVD) under a temperature condition of 860° C. to 930° C. and a pressure of 50 to 200 mbar to form a TiN layer on a base material of cemented carbide corresponding to an ISO KO5-15, M10-20 grade and used for cutting tools.

An intermediate layer was formed thereon by using reaction gasses $TiCl_4$, $CH_3CN$, $H_2$, $N_2$, and HCl under a temperature condition of 850° C. to 920° C. and a pressure of 50 to 100 mbar to form a MT-TiCN layer, and then using reaction gasses $TiCl_4$, $CH_3CN$, $H_2$, and $N_2$ under a temperature condition of 920° C. to 1020° C. and a pressure of 50 to 100 mbar to form a HT-TiCN layer.

On the intermediate layer, $TiCl_4$, $CH_3CN$, $H_2$, $N_2$, $AlCl_3$ (in the case of $AlCl_3$, converted to a gas by vaporizing in a sold phase), CO and/or $CO_2$ were used as reaction gasses under a temperature condition of 920° C. to 1020° C. and a pressure of 50 to 150 mbar to form a TiAlCNO layer. Moreover, an AlTiCNO layer was formed under an Al rich condition by using $TiCl_4$, $CH_3CN$, $H_2$, $N_2$, $AlCl_3$ (in the case of $AlCl_3$, converted to a gas by vaporizing in a sold phase), CO, and/or $CO_2$ as reaction gasses, but increasing the amount of the $AlCl_3$ gas among the reaction gasses, under a temperature condition of 920° C. to 1020° C. and a pressure of 50 to 150 mbar. This was done to provide a composition gradient with an $Al_2O_3$ layer disposed above. Furthermore, an interfacial layer was made by using reaction gasses $TiCl_4$, $H_2$, and CO or $CO_2$ to form a $TiO_2$ layer.

A D1 layer was formed on the interfacial layer under a temperature condition of 940° C. to 1000° C. and a pressure of 50 to 100 mbar by using reaction gasses $AlCl_3$, $CO_2$, and/or CO, $H_2$, HCl, and the like such that $0<V1 \leq 22$, V1 being the volume ratio of the reaction gasses CO/$CO_2$ (here, the amount of HCl among the reaction gasses was 0 to 3.5 ml/min).

Next, a D2 layer was formed under a temperature condition of 960° C. to 1020° C. and a pressure of 50 to 125 mbar by using reactions gasses $AlCl_3$, $CO_2$, and/or CO, $H_2$, HCl, and the like such that $0<V2 \leq 1.5$, V2 being the volume ratio of the reactions gasses CO/$CO_2$ (here, the amount of HCl among the reaction gasses was 1 to 4.5 ml/min).

Finally, a D3 layer was formed under a temperature condition of 980° C. to 1020° C. and a pressure of 50 to 150 mbar by using reaction gasses $AlCl_3$, $CO_2$, and/or CO, $H_2$, HCl, and the like such that $0<V3 \leq 1$, V3 being the volume ratio of the reaction gasses CO/$CO_2$ (here, the amount of HCl among the reaction gasses was 1 to 4.5 ml/min).

Through such a process as above, an alpha alumina (α-$Al_2O_3$) thin film having a triple-layered structure such as schematically illustrated in FIG. 3A was formed. Specifically, hard coating films having the structures of Examples 1 to 12 in the following Table 1 were formed through the process described above.

Moreover, as in Table 1, Comparative Examples 1 and 3 (Specimen Nos. 13 and 15), in which the underlayer, the intermediate layer, and the interfacial layers are the same and in which the α-$Al_2O_3$ layer is formed in only a single stage so as to have the microstructure such as in FIG. 3B, were prepared for comparison with the microstructures according to Examples 1 to 12 of the present invention. Moreover, each of Comparative Examples 2 and 4 in which the α-$Al_2O_3$ layer was formed in two stages to have the microstructure which is schematically illustrated in FIG. 3C was prepared in order to compare the differences between the triple-layered structure and a double-layered structure.

TABLE 1

| Specimen | Under layer TiN Thickness (μm) | Intermediate layer MT-TiCN Thickness (μm) | Intermediate layer HT-TiCN Thickness (μm) | Interfacial layer TiAlCNO Thickness (μm) | Interfacial layer AlTiCNO Thickness (μm) | Interfacial layer TiO$_2$ Thickness (μm) | α-Al$_2$O$_3$ layer D1 Thickness (μm) | α-Al$_2$O$_3$ layer D1 Grain size (μm) | α-Al$_2$O$_3$ layer D2 Thickness (μm) | α-Al$_2$O$_3$ layer D2 Grain size (μm) | α-Al$_2$O$_3$ layer D3 Thickness (μm) | α-Al$_2$O$_3$ layer D3 Grain size (μm) |
|---|---|---|---|---|---|---|---|---|---|---|---|---|
| Example 1 | 0.5 | 6 | 0.2 | 0.2 | 0.2 | 0.1 | 1.2 | 0.25 | 0.9 | 0.43 | 2.3 | 0.76 |
| Example 2 | 0.5 | 9 | 0.2 | 0.2 | 0.2 | 0.1 | 1.6 | 0.28 | 1.4 | 0.67 | 3.5 | 0.84 |
| Example 3 | 0.6 | 12 | 0.2 | 0.2 | 0.2 | 0.1 | 0.9 | 0.17 | 1.8 | 0.51 | 3 | 0.89 |
| Example 4 | 1.5 | 6 | 0.2 | 0.2 | 0.2 | 0.1 | 1.3 | 0.23 | 0.8 | 0.46 | 2.1 | 0.87 |
| Example 5 | 2 | 11 | 0.2 | 0.2 | 0.2 | 0.1 | 1.2 | 0.26 | 1.3 | 0.43 | 3.6 | 0.68 |
| Example 6 | 2 | 10 | 0.2 | 0.2 | 0.2 | 0.1 | 1.4 | 0.33 | 1.2 | 0.52 | 2.8 | 0.74 |
| Example 7 | 0.5 | 7 | 0.2 | 0.2 | 0.2 | 0.1 | 1.8 | 0.31 | 1.6 | 0.62 | 3.2 | 0.86 |
| Example 8 | 0.4 | 10 | 0.2 | 0.2 | 0.2 | 0.1 | 1.3 | 0.16 | 1.4 | 0.57 | 3.8 | 0.76 |
| Example 9 | 0.5 | 11 | 0.2 | 0.2 | 0.2 | 0.1 | 1.4 | 0.28 | 1.5 | 0.44 | 3 | 0.81 |
| Example 10 | 1.4 | 8 | 0.2 | 0.2 | 0.2 | 0.1 | 1.6 | 0.31 | 1.6 | 0.59 | 3.6 | 0.74 |
| Example 11 | 2 | 11 | 0.2 | 0.2 | 0.2 | 0.1 | 1.5 | 0.24 | 1.3 | 0.64 | 3 | 0.76 |
| Example 12 | 2 | 10 | 0.2 | 0.2 | 0.2 | 0.1 | 1.4 | 0.19 | 0.9 | 0.43 | 3.4 | 0.81 |
| Comparative Example 1 | 0.5 | 10 | 0.2 | 0.2 | 0.2 | 0.1 | 6 | 0.60 | — | — | — | — |
| Comparative Example 2 | 0.6 | 10 | 0.2 | 0.2 | 0.2 | 0.1 | 1 | 0.40 | 4.8 | 0.7 | — | — |
| Comparative Example 3 | 0.7 | 9 | 0.2 | 0.2 | 0.2 | 0.1 | 6 | 0.40 | — | — | — | — |
| Comparative Example 4 | 0.5 | 10 | 0.2 | 0.2 | 0.2 | 0.1 | 1 | 0.50 | 5.1 | 0.8 | — | — |

In the hard thin films prepared as above, the thickness of the α-Al$_2$O$_3$ layer and the ratios of the grain size and thickness between the D1 layer and the D2 layer, and the D1 layer and the D3 layer are as in the following Table 2.

TABLE 2

| Specimen | α-Al$_2$O$_3$ layer D1 Thickness (μm) | α-Al$_2$O$_3$ layer D1 Grain size (μm) | α-Al$_2$O$_3$ layer D2 Thickness (μm) | α-Al$_2$O$_3$ layer D2 Grain size (μm) | α-Al$_2$O$_3$ layer D3 Thickness (μm) | α-Al$_2$O$_3$ layer D3 Grain size (μm) | Total Thickness (μm) | Grain size ratio D3/D1 S1 | Grain size ratio D2/D1 S2 | Thickness ratio D3/D1 T1 | Thickness ratio D2/D1 T2 |
|---|---|---|---|---|---|---|---|---|---|---|---|
| Example 1 | 1.2 | 0.25 | 0.9 | 0.43 | 2.3 | 0.76 | 4.4 | 3.0 | 1.7 | 1.9 | 0.8 |
| Example 2 | 1.6 | 0.28 | 1.4 | 0.67 | 3.5 | 0.84 | 6.5 | 3.0 | 2.4 | 2.2 | 0.9 |
| Example 3 | 0.9 | 0.17 | 1.8 | 0.51 | 3 | 0.89 | 5.7 | 5.2 | 3.0 | 3.3 | 2.0 |
| Example 4 | 1.3 | 0.23 | 0.8 | 0.46 | 2.1 | 0.87 | 4.2 | 3.8 | 2.0 | 1.6 | 0.6 |
| Example 5 | 1.2 | 0.26 | 1.3 | 0.43 | 3.6 | 0.68 | 6.1 | 2.6 | 1.7 | 3.0 | 1.1 |
| Example 6 | 1.4 | 0.33 | 1.2 | 0.52 | 2.8 | 0.74 | 5.4 | 2.2 | 1.6 | 2.0 | 0.9 |

TABLE 2-continued

| | α-Al₂O₃ layer | | | | | | | Grain size ratio | | Thickness ratio | |
|---|---|---|---|---|---|---|---|---|---|---|---|
| | D1 | | D2 | | D3 | | Total | | | | |
| | Thickness | Grain | Thickness | Grain | Thickness | Grain | Thickness | | | | |
| Specimen | ness (μm) | size (μm) | ness (μm) | size (μm) | ness (μm) | size (μm) | ness (μm) | D3/D1 S1 | D2/D1 S2 | D3/D1 T1 | D2/D1 T2 |
| Example 7 | 1.8 | 0.31 | 1.6 | 0.62 | 3.2 | 0.86 | 6.6 | 2.8 | 2.0 | 1.8 | 0.9 |
| Example 8 | 1.3 | 0.16 | 1.4 | 0.57 | 3.8 | 0.76 | 6.5 | 4.8 | 3.6 | 2.9 | 1.1 |
| Example 9 | 1.4 | 0.28 | 1.5 | 0.44 | 3 | 0.81 | 5.9 | 2.9 | 1.6 | 2.1 | 1.1 |
| Example 10 | 1.6 | 0.31 | 1.6 | 0.59 | 3.6 | 0.74 | 6.8 | 2.4 | 1.9 | 2.3 | 1.0 |
| Example 11 | 1.5 | 0.24 | 1.3 | 0.64 | 3 | 0.76 | 5.8 | 3.2 | 2.7 | 2.0 | 0.9 |
| Example 12 | 1.4 | 0.19 | 0.9 | 0.43 | 3.4 | 0.81 | 5.7 | 4.3 | 2.3 | 2.4 | 0.6 |
| Comparative Example 1 | 6 | 0.60 | — | — | — | — | 6 | — | — | — | — |
| Comparative Example 2 | 1 | 0.40 | 4.8 | 0.7 | — | — | 5.8 | — | 1.8 | — | 4.8 |
| Comparative Example 3 | 6 | 0.40 | — | — | — | — | 6 | — | — | — | — |
| Comparative Example 4 | 1 | 0.50 | 5.1 | 0.8 | — | — | 6.1 | — | 1.6 | — | 5.1 |

As displayed in Table 2, S1, which is the D3/D1 grain size ratio, for Examples 1 to 12 of the present invention is 2.2 to 5.2, and S2, which is the D2/D1 grain size ratio, is 1.6 to 3.6.

Moreover, T1, which is the D3/D1 thickness ratio, is 1.6 to 3.3, and T2, which is the D2/D1 thickness ratio, is 0.6 to 2.0.

Since Comparative Example 1 and Comparative Example 3 are cases in which growth to the final thickness occurred immediately after nucleation, multi-stage growth such as for Examples 1 to 12 of the present invention did not occur, and thus ratios S1 and S2 were not calculated.

Meanwhile, in the case of Comparative Example 2 and Comparative Example 4, growth occurred in two stages, and S1 is 1.8 and 1.6 in Comparative Example 2 and Comparative Example 4, respectively.

Thus, the α-Al₂O₃ layer according to the present invention was controlled to have a finer grain size at the interface than Comparative Examples 1 to 4.

Microstructure of α-Al₂O₃ Layer

FIG. 4 is a cross-sectional scanning electron microscope image of a hard thin film formed according to Comparative Example 11 of the present invention. FIG. 5 is a cross-sectional scanning electron microscope image of a hard thin film formed according to Comparative Example 4 of the present invention. FIG. 6 is an enlarged view of a portion of a scanning electron microscope image of an α-Al₂O₃ thin film formed according to Comparative Example 4 of the present invention.

As illustrated in FIG. 4, since nucleation and growth occurs in three stages for an α-Al₂O₃ layer (bright grey layer at the top) according to Comparative Example 11 of the present invention, the grain size in the middle portion of the thin film is fine, and the grain size in the lower portion is extremely dense such that almost no pores are observed in the boundary part with the layer below.

In contrast, as illustrated in FIG. 5, in the case of the α-Al₂O₃ layer (bright grey layer at the top) in which nucleation and growth occurs in two stages in accordance with Comparative Example 4, it may be known that the grain size in the middle portion is comparatively larger than in Example 11. Consequently, as illustrated in FIG. 6, a structure which is not dense (black areas in the figure) is observed in various areas in the lower portion of the α-Al₂O₃ layer.

Adhesive Strength and Hardness of α-Al₂O₃ Layer

The adhesive strength and hardness of the α-Al₂O₃ layers prepared as above were measured and compared. Here, the adhesive strength was measured with a scratch test method using a scratch tester sold by J&L Tech (scratch tester, model name: JLSTOLL), and the microhardness was measured using a Fischerscope (HP100-XYP, Germany, HELMUT FISCHER GMBH, ISO14577)

Specific adhesive strength and hardness measurement conditions are as in Table 3.

TABLE 3

| [Scratch test conditions] | [Microhardness test conditions] |
|---|---|
| Load: 0 to 150 N | Load: 100 mN |
| Scratch length: 10.00 mm | Unload: 100 mN |
| Scratch speed: 0.17 mm/s | Load time: 10 seconds |
| | Unload time: 10 seconds |
| | Creep time: 5 seconds |

The results of performing the tests under the above conditions were as in Table 4.

TABLE 4

| Specimen | D3/D1 Grain size ratio (S1) | D2/D1 Grain size ratio (S2) | Mechanical properties Friction (N) | Hardness (GPa) |
|---|---|---|---|---|
| Example 1 | 3 | 1.8 | 134 | 31.3 |
| Example 2 | 3 | 1.4 | 129 | 31.4 |
| Example 3 | 5.2 | 2.6 | 143 | 31.1 |
| Example 4 | 3.8 | 1.6 | 142 | 31.8 |
| Example 5 | 2.6 | 2.0 | 124 | 31.6 |
| Example 6 | 2.2 | 2.0 | 131 | 31.4 |
| Example 7 | 2.8 | 2.7 | 124 | 32.2 |
| Example 8 | 4.8 | 1.7 | 145 | 31.9 |
| Example 9 | 2.9 | 2.0 | 132 | 32.3 |
| Example 10 | 2.4 | 1.1 | 134 | 32.4 |
| Example 11 | 3.2 | 1.3 | 124 | 32.1 |
| Example 12 | 4.3 | 1.5 | 137 | 32 |
| Comparative Example 1 | — | 1.7 | 98 | 31.6 |
| Comparative Example 2 | — | 1.6 | 104 | 31.8 |
| Comparative Example 3 | — | 1.9 | 83 | 32.1 |
| Comparative Example 4 | — | 2.5 | 96 | 32.4 |

As confirmed in Table 4, it may be seen that when compared to the adhesive strength being 124 to 143 N for the α-Al₂O₃ layer prepared according to Examples 1 to 12 of the present invention, the adhesive strength is lower, being 83 to 104 N, for the α-Al₂O₃ layer prepared according to Comparative Examples 1 to 4. That is, the adhesive strength of the α-Al₂O₃ thin film according to an embodiment of the present invention is significantly improved when compared to the α-Al₂O₃ thin film formed according to a typical method.

Meanwhile, as a result of measuring the hardness of the α-Al₂O₃ layer, the hardness of Examples 1 to 12 of the present invention and Comparative Examples 1 to 4 were nearly identical, which is seen as reflecting being made of the same materials.

Cutting Test Results

The performance exhibited by the hard coating film prepared according to Examples 1 to 12 of the present invention and the hard coating film prepared according to Comparative Examples 1 to 4 under a cast iron processing condition and a stainless steel processing was evaluated using the following cutting conditions, and the results thereof are as in Table 5.

(1) Cast Iron Cutting Conditions

Processing method: turning

Work piece: GCD450-4 (groove processing)

Vc (cutting speed)=380 (mm/min)

fn (feed speed)=0.35 (mm/min)

ap (depth of cut)=1.5 mm, wet (2) Stainless Steel Cutting Conditions

Processing method: turning

Work piece: SUS316-4 (groove processing)

Vc (cutting speed)=200 (mm/min)

fn (feed speed)=0.2 (mm/min)

ap (depth of cut)=1.5 mm, wet

TABLE 5

| | | | Cutting lifespan | | | |
| | | | Cast iron processing | | Stainless steel processing | |
| Specimen | D3/D1 (S1) | D2/D1 (S2) | (sec) | Lifespan tendency | (sec) | Lifespan tendency |
|---|---|---|---|---|---|---|
| Example 1 | 3 | 1.8 | 320 | Chipping | 110 | Fine chipping |
| Example 2 | 3 | 1.4 | 330 | Chipping | 90 | Chipping |
| Example 3 | 5.2 | 2.6 | 360 | Fine chipping | 90 | Damage |
| Example 4 | 3.8 | 1.6 | 360 | Fine chipping | 120 | Fine chipping |
| Example 5 | 2.6 | 2.0 | 340 | Damage | 90 | Chipping |
| Example 6 | 2.2 | 2.0 | 320 | Damage | 90 | Chipping |
| Example 7 | 2.8 | 2.7 | 330 | Chipping | 120 | Fine chipping |
| Example 8 | 4.8 | 1.7 | 350 | Fine chipping | 100 | Chipping |
| Example 9 | 2.9 | 2.0 | 330 | Chipping | 110 | Chipping |
| Example 10 | 2.4 | 1.1 | 330 | Damage | 120 | Fine chipping |
| Example 11 | 3.2 | 1.3 | 360 | Chipping | 90 | Chipping |
| Example 12 | 4.3 | 1.5 | 350 | Fine chipping | 90 | Chipping |
| Comparative Example 1 | 0 | 1.7 | 290 | Chipping | 70 | Chipping |
| Comparative Example 2 | 0 | 1.6 | 290 | Chipping | 60 | Chipping |
| Comparative Example 3 | 0 | 1.9 | 280 | Damage | 80 | Chipping |
| Comparative Example 4 | 0 | 2.5 | 310 | Chipping | 80 | Chipping |

As displayed in Table 5, under the cast iron and stainless steel processing conditions, when compared to the case of the hard coating film prepared according to Examples 1 to 12 of the present invention, in which the cutting lifespan is 320 to 360 seconds when processing cast iron, in the case of the hard coating film prepared according to Comparative Examples 1 to 4, the cutting lifespan is 280 to 310 seconds, and thus it may be seen that the cutting lifespan is inferior to the Examples of the present invention.

Moreover, when compared to the case of the hard coating film prepared according to Examples 1 to 12 of the present invention, in which the cutting lifespan is 90 to 120 seconds when processing stainless steel, in the case of the hard coating film prepared according to Comparative Examples 1 to 4, the cutting lifespan is 60 to 80 seconds, and thus, as in the case of processing cast iron, it may be seen that the cutting lifespan is inferior to the Examples of the present invention.

From the above results, it may be seen that the microstructure of the α-Al₂O₃ thin film prepared according to an embodiment of the present invention has a significant effect in extending the lifespan of the cutting tool when processing materials such as cast iron or stainless steel.

The invention claimed is:

1. An alpha alumina (α-Al2O3) thin film which has a thickness of T and is formed on a lower layer which is formed on a base material, the α-Al2O3 thin film being divided into:
  a D1 layer which is positioned between an interfacial layer and 0.15T above the interfacial layer;
  a D2 layer which is positioned between 0.15T and 0.4T above the interfacial layer; and
  a D3 layer which is positioned between 0.4T and 1T above the interfacial layer, wherein S1 (the grain size of the D3 layer/the grain size of the D1 layer) is 2 to 5.5, and S2 (the grain size of the D2 layer/the grain size of the D1 layer) is 1.5 to 4, wherein the lower layer comprises:

a TiN layer formed on the base material;

a MT-TiCN layer formed on the TiN layer; and an interfacial layer containing Ti and formed on the TiCN layer, and wherein the interfacial layer comprises:

a TixAl1-xCNO layer formed on the MT-TiCN layer;

a AlyTi1-yCNO layer formed on the TixAl1-xCNO layer; and a Ti oxide layer formed on the AlyTi1-yCNO layer.

2. The α-Al2O3 thin film of claim 1, wherein the base material is a cemented carbide containing 5 to 10 wt % of Co, and at most 1 wt % of (Ta,Nb)C.

3. The α-Al2O3 thin film of claim 1, wherein:

the thickness of the TiN layer is 0.1 to 2 μm;

the thickness of the MT-TiCN layer is 3 to 10 μm;

the thickness of the interfacial layer is 0.1 to 1 μm; and the thickness of the α-Al2O3 layer is 2 to 8 μm.

4. The α-Al2O3 thin film of claim 1, wherein:

the grain size of the D1 layer is 0.1 to 0.5 μm;

the grain size of the D2 layer is 0.15 to 0.8 μm; and the grain size of the D3 layer is 0.4 to 1.5 μm.

5. The α-Al2O3 thin film of claim 1, wherein the surface roughness (Ra) of the α-Al2O3 thin film is at most 250 nm.

* * * * *